(12) United States Patent
Joshi et al.

(10) Patent No.: US 6,442,735 B1
(45) Date of Patent: Aug. 27, 2002

(54) SOI CIRCUIT DESIGN METHOD

(75) Inventors: Rajiv V. Joshi, Yorktown Heights, NY (US); Karl E. Kroell, Altdorf (DE)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/525,363

(22) Filed: Mar. 15, 2000

(51) Int. Cl.⁷ .............................................. G06F 17/50
(52) U.S. Cl. .................. 716/4; 716/18; 716/1
(58) Field of Search .................... 703/14, 2, 13, 703/15, 16; 716/2, 6, 1, 4, 5, 10, 18

(56) References Cited

U.S. PATENT DOCUMENTS

| | | | | |
|---|---|---|---|---|
| 5,883,814 A | * | 3/1999 | Luk et al. ........................ | 716/2 |
| 6,167,363 A | * | 12/2000 | Stapleton ...................... | 703/14 |
| 6,266,800 B1 | * | 7/2001 | Uhlmann et al. ............... | 716/6 |
| 6,298,467 B1 | * | 10/2001 | Chuang et al. ................. | 716/2 |

* cited by examiner

Primary Examiner—Matthew Smith
Assistant Examiner—Paul Dinh
(74) Attorney, Agent, or Firm—Louis J. Percello; Fitch, Even, Tabin & Flannery

(57) ABSTRACT

A computer program product method of circuit design of a multiple input circuit, macro or chip, especially for silicon on insulator (SOI) circuits. For a multiple input circuit, an object list of items corresponding to circuit devices is created. The items model local effects on corresponding circuit elements. The circuit is analyzed using Static or DC analysis to provide initial local effects on circuit devices, including body effects and local heat effects. The initial local effects are passed to the circuit model for transient analysis. The local effects from checked transient results are checked and updated. The transient response is rerun and the local effects are updated until the change in local effects is below an upper limit. For added efficiency, unswitching devices may be eliminated from the iterative analysis and analysis may be limited to the period when switching occurs.

23 Claims, 4 Drawing Sheets

SOI CIRCUIT DESIGN METHOD

BACKGROUND OF THE INVENTION

1. Field of the Invention

The present invention generally relates to semiconductor integrated circuit design and, more particularly, to methods of simulating and designing silicon on insulator integrated circuits.

2. Background Description

In recent years silicon on insulator (SOI) technology has become the main force for performance improvement for transistors in addition to scaling. SOI transistors may be formed on the surface of a silicon layer isolated from a silicon substrate by a buried oxide (BOX) layer. In a typically complex series of mask steps, shallow trenches filled with oxide isolate SOI islands of the surface silicon layer on which circuits are formed. Device channels may be allowed to float or, if desired, local contacts may be made to each of the circuit's conduction wells and at least one body contact may be made to the silicon layer island. For many circuits it may be sufficient to form a single body contact to a p-type silicon island layer at a common point with n-type field effect transistors (NFETs) distributed around the island. Normally, slight variations in device characteristics such as device thresholds, are negligible, neglectable and not given much consideration for typical logic circuits such as sense amplifiers, decoders, clock buffers, input or output drivers and array output drivers.

However, to further increase device density and improve performance, body contacts are eliminated or shared by larger and larger numbers of devices. As the body contact density is reduced while device density increases, individual devices become much more susceptible to localized heating and what is known as body effects.

Body effects occur especially in analog logic circuits, memories or logic where the SOI body layer contacts may be infrequent or, in devices with completely isolated (i.e., no body contact) floating device channels. As a particular device switches, charge is coupled into/out of the channel body. Device leakage and parasitic bipolar effects may add to the charge. Charge builds at isolated locations as the chip operates because the charge from fast switching devices is injected into locally isolated body pockets faster than it dissipates and, eventually, the injected charge reaches some steady state value that acts as a substrate bias for the device.

Localized heating occurs because these electrically isolated devices are thermally isolated as well. Devices dissipate power during switching that is dependent upon device switching current. In a typical non-SOI technology, heat would dissipate through an underlying silicon substrate or through metal connections above. However, for SOI self heating within a device does not dissipate immediately because of the additional thermal isolation. Over time, as the device is heated and re-heated, residual heat elevates that device's steady state temperature above other less active devices on the same chip/circuit.

FET device characteristics, including threshold voltage ($V_t$) and device currents, are dependent upon device substrate voltage ($V_{sx}$) and temperature. So, localized temperature and body effect variations cause device non-uniformity. Further, since these localized differences are zero, initially, and build up with time as the circuit operates, circuit characteristics for identical circuits also vary with time. These variations can cause circuit malfunctions that are difficult to diagnose and find, much less anticipate during design.

These variations are especially troublesome for memory chips or macros with large arrays of memory cells, such as Random Access Memory (RAM) chips. A Static RAM (SRAM) is, essentially, an identical pair of cross coupled transistors loaded with high resistance load resistors and a pair of pass transistors between internal storage nodes and a pair of bit lines. The state of the cross coupled pair determines the state of data stored in the cell. Each SRAM cell is read by coupling the cross coupled transistors through the access transistors to the bit line pair and measuring the resulting voltage difference on the bit line pair. The signal on the bit line pair increases with time toward a final state wherein each one of the pair may be, ultimately, a full up level and a full down level. However, to improve performance, the voltage difference is sensed well before the difference reaches its ultimate value.

A Dynamic RAM (DRAM) cell is essentially a capacitor for storing charge and a pass transistor (also called a pass gate or access transistor) for transferring charge to and from the capacitor. Data (1 bit) stored in the cell is determined by the absence or presence of charge on the storage capacitor. Each DRAM cell is read by coupling the cell's storage capacitor (through the access transistor) to a bit line, which is a larger capacitance, and measuring the resulting voltage difference on the bit line. Typically, the bit line signal is a few hundred millivolts (mv) that develops asymptotically from the time that the access transistor is turned on dependent upon the overall RC time constant of the signal path.

Repetitively accessing a cell induces local effects in the cell. Localized effects that, increase thresholds and reduce device currents, can reduce the charge stored in DRAM cells and reduce the voltage passed by access transistors. These local effects can cause an imbalance in the cross coupled pair devices in an SRAM cell, or local effects in pass gates of an SRAM cell cause an apparent imbalance. Further, local effects can increase path resistance which increases the cell write time (i.e., the time required to store the charge in the DRAM cell or to switch the state of the cross coupled pair in the SRAM cell) and increases cell sense time, i.e., the time required to develop sufficient signal to sense. As a result, intermittent problems may arise, such as spuriously in sensing the wrong data.

Furthermore, to achieve high DRAM performance, state of the art sense amplifiers, typically a pair of cross coupled transistors, must sense a potential difference that is something less than the ultimate few hundred millivolt signal. The smaller the potential difference that the sense amplifier can sense the better. So, any difference in the transistors in the cross coupled pair increases the necessary potential difference and, therefore, slows sensing. Therefore, it is important that the transistors in the cross-coupled pair have identical device characteristics and are what is known as a balanced or matched pair. As a consequence, great care is taken in designing a balanced pair to insure that each transistor is influenced by ambient conditions identically with the other of the pair.

However, other constraints may further complicate the task of designing a matched pair of transistors. For example, each sense amplifier may be constrained to fit on the same pitch as a pair of adjacent bit lines, each pair of adjacent bit lines being coupled to a corresponding sense amplifier. In this example in addition to other constraints, the cross coupled transistor pair must fit in a very narrow pitch. This narrow pitch further complicates transistor design placement (layout) to achieve a balanced pair, especially for SOI circuits. Localized effects occurring on only one of the balanced pair of FETs may reduce the original design noise margin enough to make a particular sense amplifier useless. Further, localized effects in a balanced sense amplifier pair may be exhibited as a pattern dependent or sporadic failure, making it very difficult to diagnose.

FIG. 1 shows a typical body effect model 100 for a single NFET, which is modeled as a capacitive voltage divider including capacitors between a device channel or body node 102 and each of device nodes, source 104, drain 106 and gate 108 and a node 110 representing an underlying substrate layer. Device source/drain diffusions are represented by a pair of back to back diodes each between one of the source 104 or drain 106 and the body node 102. This prior art model 100 is adequate for determining the body effects for a single FET. Simply by providing a signal to one or more terminals and biasing the rest, after some number of signal transitions, the body node 102 will reach a steady state bias value. That steady state bias value is the body effect voltage on that device.

However, for more complicated circuits with multiple inputs, this prior art approach has failed to accurately predict variations and is inadequate for evaluating localized effects on a macro or a circuit. Further, including this body effect model with each FET adds complexity to a chip, macro or circuit model making simulation of the entire circuit even more time consuming and impractical, e.g., for a circuit with 100,000 FETs adding 400,000 capacitors and 200,000 diodes to the model.

Another problem with predicting these localized effects of heat and body effect is that the result can be significantly different depending on the device's switching history. So, an accurate calculation of these history effects on a large array or a large macro would require a significant amount of computation time for the simulation of thousands of circuit cycles. Calculating these effects even for a moderately sized circuit may be prohibitive.

Thus, there is a need for a technique to accurately and efficiently evaluate history related device effects on large macros.

OBJECTS OF THE INVENTION

It is a purpose of the present invention to improve integrated circuit design;

It is another purpose of the present invention to accurately predict localized temperature effects for SOI devices;

It is yet another a purpose of the present invention to accurately predict localized temperature and body effects for SOI circuits;

It is yet another object of the present invention to accurately predict localized body effects for SOI circuits;

It is yet another object of the present invention to identify cross-coupled device mismatches resulting from body effects.

SUMMARY OF THE INVENTION

The present invention is a computer program product method of circuit design of a multiple input circuit, macro or chip, especially for silicon on insulator (SOI) circuits. For a multiple input circuit, an object list of items corresponding to circuit devices is created. The items model local effects on corresponding circuit elements. The circuit is analyzed using Static or DC analysis to provide initial local effects on circuit devices, including body effects and local heat effects. The initial local effects are passed to the circuit model for transient analysis. The local effects from checked transient results are checked and updated. The transient response is rerun and the local effects are updated until the change in local effects is below an upper limit. For added efficiency, unswitching devices may be eliminated from the iterative analysis and analysis may be limited to the period when switching occurs. Each device's history effect is the difference between its final steady state condition and its initial static or DC analysis run condition. The invention can be utilized for complex circuits such as analog or radio frequency circuits or large arrays such as memories, requiring substantially less computer run time than traditional approaches.

BRIEF DESCRIPTION OF THE FIGURES

The foregoing and other objects, aspects and advantages will be better understood from the following detailed preferred embodiment description with reference to the drawings, in which.

DETAILED DESCRIPTION OF THE INVENTION

Figure 2:
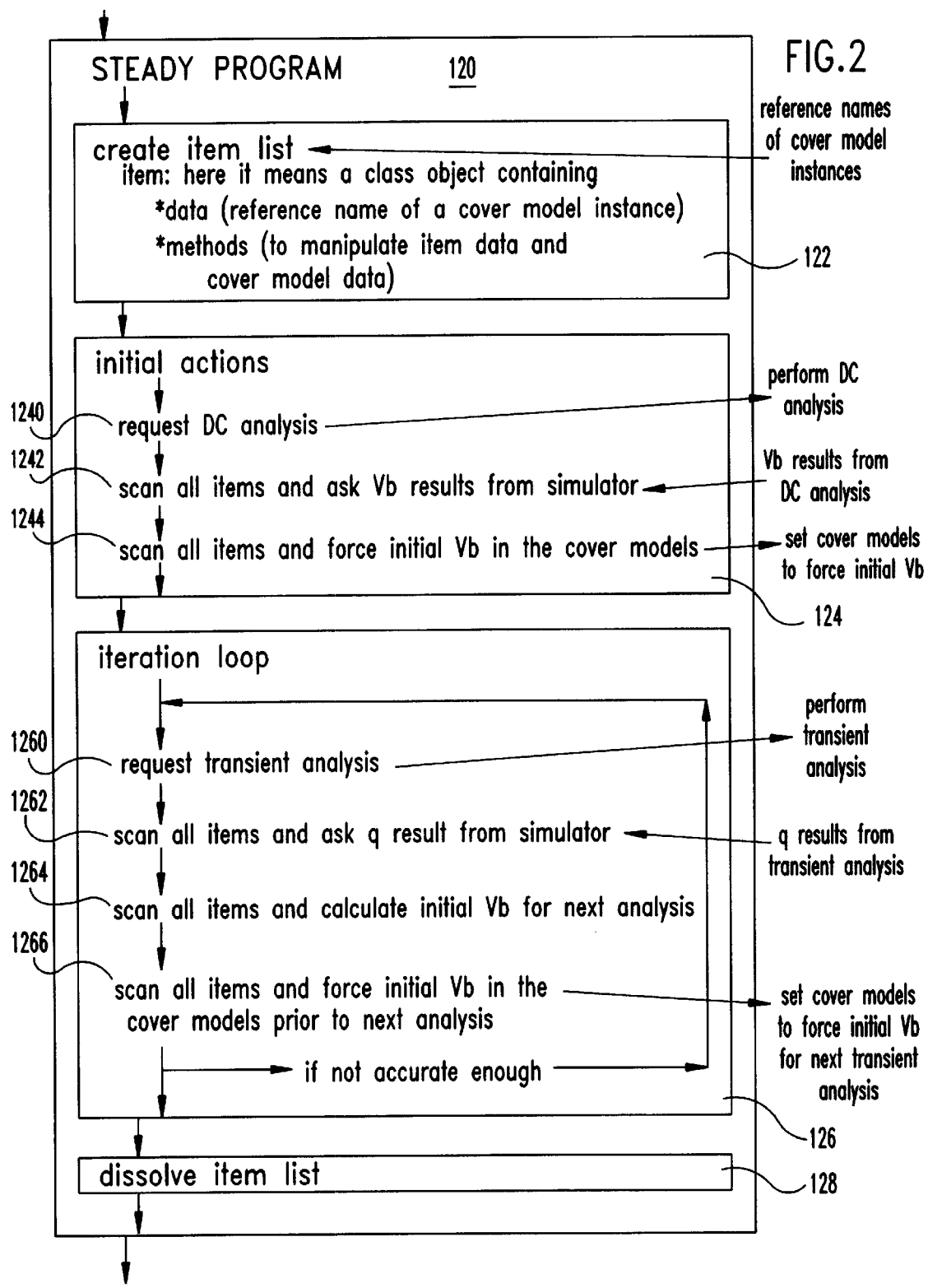
FIG. 2 shows program flow for STEADY, the preferred method of modeling local effects for an entire macro or chip.

Referring now to the drawings, and more particularly, FIG. 2 shows program flow for the preferred method 120 of modeling local effects including both body and temperature effects for an entire macro or chip according to the preferred embodiment, referred to herein as STEADY. STEADY 120 is intended to operate within the circuit simulator environment in cooperation with other state of the art circuit simulation programs, e.g., SPICE or ASX, referred to herein, generically, as standard simulation programs or standard circuit simulators and, device models for such standard simulation programs are referred to herein as standard models. Further, as referred to herein, a "cover" model has the same model name as a corresponding standard model, but includes additional functionality required to perform the method of the preferred embodiment. Accordingly, many of the steps included in STEADY 120, which uses cover models in place of standard models, may be done in cooperation with a standard model in the standard simulation program.

STEADY 120 includes four major steps. In the first major step 122 a list of items or objects is generated, each item containing a reference to a transistor or thermal current source in the circuit, macro or chip being modeled. For simplicity and not intended as a limitation, circuit, macro and chip are used interchangeably herein. In the second major step 124 all initial actions are carried out to initialize the macro. Then, after initializing the macro, an iteration loop is executed in step 126 until the difference between results from iteration to iteration is below a selected maximum. Finally, in step 128 the item list is dissolved and calculation ends. At this point if the circuit's designer is unsatisfied with the simulation results, devices may be modified for improved results and the analysis may be repeated.

Optionally, for expedited circuit analysis, the cover models may be used for initializing transistor body voltages in circuits by providing body initialization voltages, foregoing the iterative calculation step 126. Body voltages are passed through the cover models to the standard models. Alternatively, for a quick estimation, body voltages may be generated by sweeping voltages on device terminals, e.g., sweeping FET gate, drain and/or source terminals from ground (0V) to supply ($V_{hi}$). Further, gate level "best case" or "worst case" analysis may be facilitated providing body voltages derived at macro level for individual gate level analysis. Such analysis provides a basis for comparison of higher level analysis and more accurate standard simulation analysis.

Figure 3:
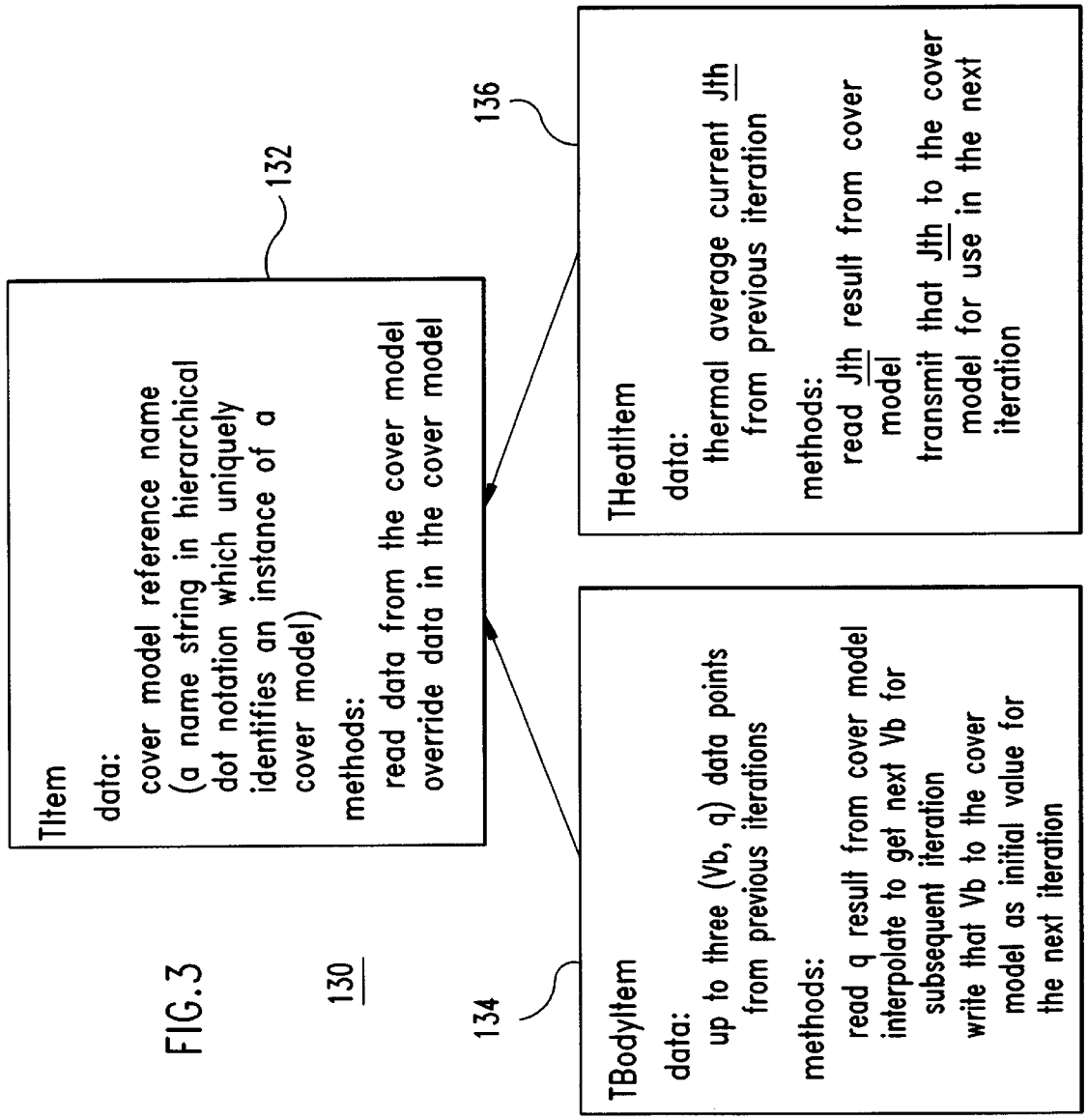
FIG. 3 shows the preferred object 130 data structure.

The object list generated in step 122 allows interaction between STEADY 120 and corresponding element cover models describing the macro and, thereby, with the standard simulation program. FIG. 3 shows the preferred object 130 data structure. Each object 130 belongs to a class within a class hierarchy. The base class is defined by TItem 132 from which two specialized classes inherit. Each object of class TItem 132 includes an entry that uniquely identifies the circuit element (e.g. a field effect transistor (FET)) to which the object is associated. A typical entry is a namestring in hierarchical dot notation.

The first of the two specialized classes, TBodyItem 134, provides all methods and data storage necessary to determine the body effects of transistors. The second of the two specialized.classes, THeatItem 136, provides all methods and data storage necessary to determine the self heating effects. Objects of class TBodyItem 134 are associated with FETs of the circuit. Objects of class THeatItem 136 are associated with the circuit such as heat sources of FETs or models of other circuit elements that generate heat, including passive elements such as resistors. The STEADY circuit netlist includes two parts: an electrical netlist part containing body effect components like body effect model capacitors, resistors and current sources; and, a thermal netlist part containing thermal effect model components like capacitors, resistors and current sources. The item list generated in the first major step 122 is used in subsequent steps, when all of the listed items and are scanned and appropriate actions are invoked for the listed items in cooperation with the cover models of the circuit elements.

For simplicity, the steps of the preferred method of FIG. 2 are shown for determining the macro body effect for TBodyItem 134 class items. However, it is understood that a typical multiple input circuit item list would include both TBodyItems 134 and THeatItems 136, in particular, if both the body effect and self heating effect are being considered.

When the model is initialized in the second major step 124, first what is typically referred to as "DC" analysis is requested in 1240 to determine "DC" initial conditions. This means the circuit is simulated as having its input voltages at START TIME applied for an infinitely long time prior to START TIME and the transient simulation starts with this result as its initial state at START TIME. The request for DC analysis is passed to the standard simulation program which determines the circuit's DC initial conditions. Preferably, this START TIME is chosen to coincide with the starting point of the analysis time cycle (PSTART) specified by the model user, e.g. a circuit designer, for which the body and self heating effects are being investigated. The DC analysis results are used as initial body voltage values, i.e., initial conditions, in the subsequent first transient analysis. STEADY 120 retrieves the DC analysis results in 1242 from the standard circuit simulator and, then, passes the results to the cover models as initial conditions in a subsequent transient analysis. STEADY 120 also saves these results in their corresponding items in 1244 for use later in calculating and forcing modified initial conditions.

Figure 4:
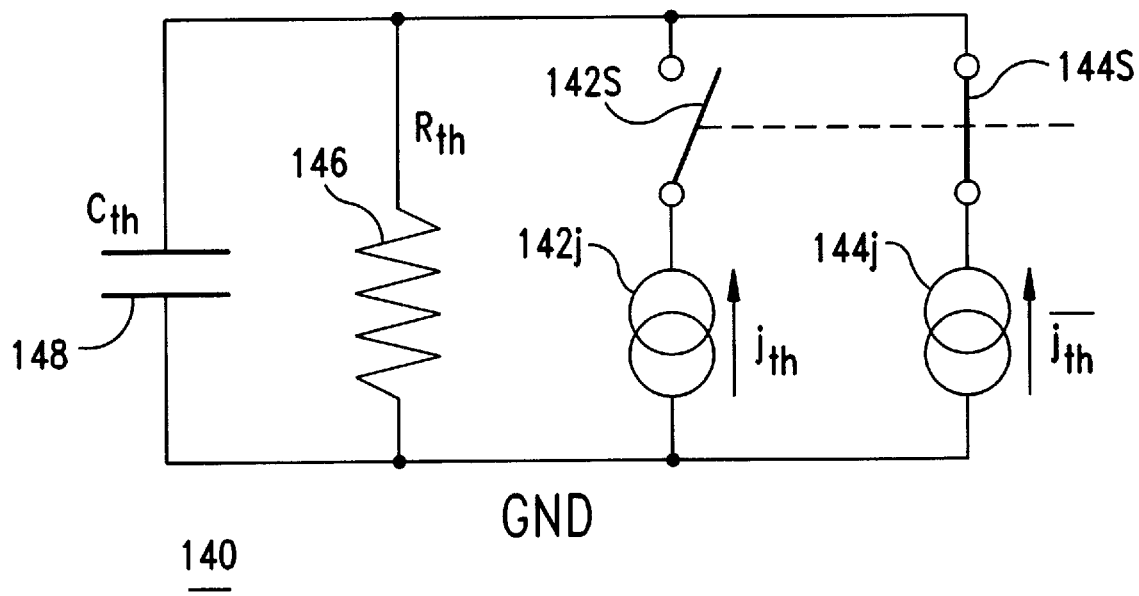
FIG. 4 is a schematic diagram of a transistor model for calculating self heating effects.

FIG. 4 is a schematic of a simple example of a thermal model 140, e.g., of an FET, for local self heating analysis by STEADY 120 using HeatItems 136. The thermal model 140 includes a pair of parallel switched current sources 142j, 144j selectively driving a in parallel with a capacitor 148. The current sources represent local sources of heat flow, resistor 146 represents the thermal analogon to an electrical resistor, i.e. a thermal resistivity and capacitor 148 is the thermal analogon of an electrical capacitor, a heat capacitance. Switches 142s, 144s are provided to selectively include or exclude a corresponding one of the current sources 142j, 144j. Current source 142j is normally included in standard models and is time varying to represent normal time varying localized heating current. Current source 144j provides a constant current, representing an average heating current determined iteratively.

Initially, the average current from current source 142j is set to zero, representing no localized heating. The time varying effects at the particular heat source represented by current source 142j is averaged during each iteration. Ultimately, at thermal equilibrium: the average local heat effect has been determined and current source 142j is not considered; the extent of localized heating is represented by the average heat flow 144j through thermal resistance 146 and, thermal capacitance 148 is charged to a final temperature.

Figure 5:
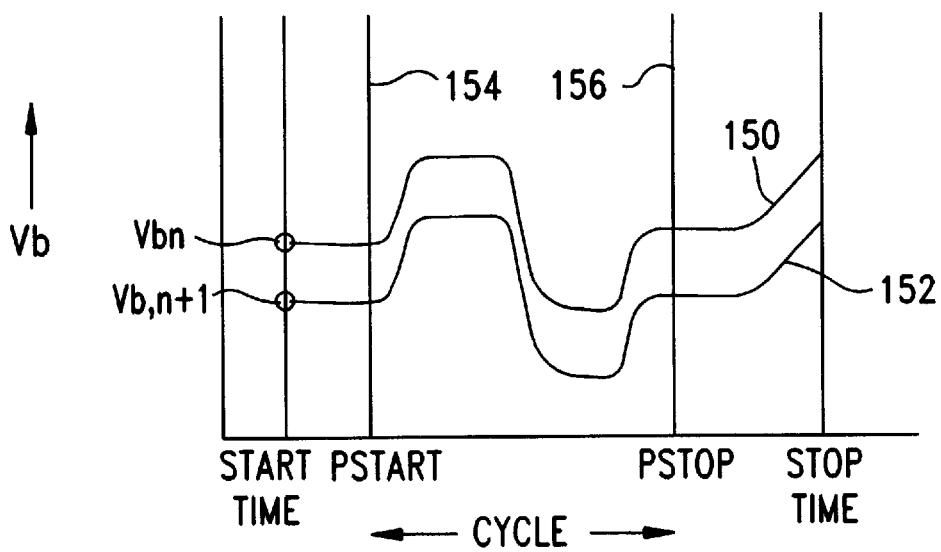
FIG. 5 graphically represents the body effect simulation iteration on a transistor in a circuit, macro or chip model.

Iterative transient analysis begins in the next major step 126, both for self heating and for body effects. The graph of FIG. 5 represents the body effect simulation iteration 150, 152 on the circuit model in 1260. The START TIME and the STOP TIME are the normal transient simulation beginning and end points, respectively. The circuit response relevant for STEADY, however, begins at the cycle boundary PSTART 154 and ends at a corresponding cycle boundary PSTOP 156, both inputs specified by the user. STEADY 120 retrieves the results from the iteration 150, 152 for each device in 1262. The first transient run is an initialization run for localized heating and the first three transient runs are initialization runs for body effects as described below. During each iteration 150, 152 subsequent to initialization, a better approximation for the average current 144j and the initial condition body voltage Vb is calculated and used for the next iteration 150, 152.

For localized heating analysis, in the first transient iteration all average currents 144j are set to zero and an average thermal current is approximated as an initial condition for the next transient iteration. The average is calculated from the time dependent thermal current which would flow in the thermal circuit with switch 142s closed and 144s open. In each subsequent transient iteration the average thermal current is the value calculated from the previous transient iteration.

Figure 1:
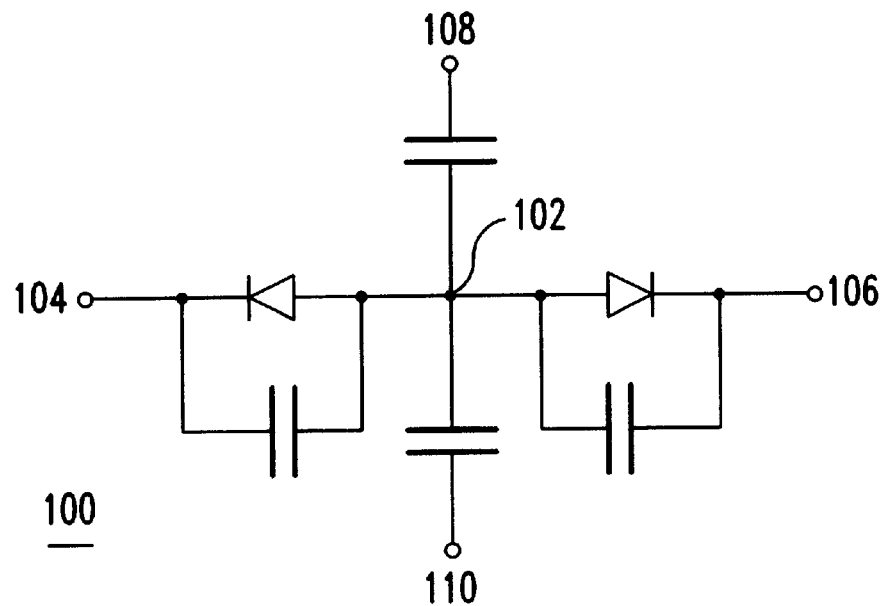
FIG. 1 shows a typical body effect model for a single NFET, which is modeled as a capacitance voltage divider and a pair of back to back diodes.
Figure 6:
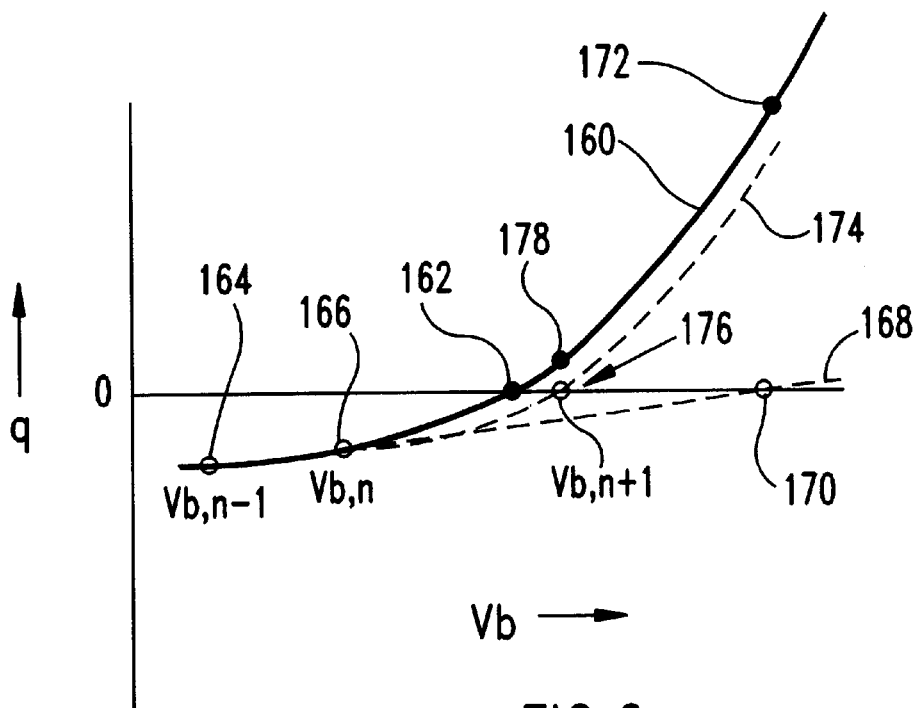
FIG. 6 shows a graphical comparison of linear and exponential extrapolation with brute force calculation results.

FIG. 6 shows transistor body charge (q) as a function of initial body voltage (Vb). Each transient analysis iteration provides a data point on curve 160. Vb is the body voltage at START TIME in FIG. 5 with charge q being the charge accumulated in the corresponding body during a particular iteration. The transistor cover models are used to calculate the charge q that accumulates in the transistor's body from PSTART to PSTOP. Charge accumulation between START TIME and PSTART is disregarded, as is charge accumulation between PSTOP and STOP TIME. As a result, the finally calculated steady state is based only the time period from PSTART to PSTOP. The transient simulation may be carried out over the time period from START TIME to STOP TIME. Steady state is characterized as that value of Vb for which q becomes zero, point 162 on curve 160. Initially, the exact solution 162 is not known but, it can be approached iteratively from previously calculated data points on curve 160. FIG. 6 show two possible approaches to choosing a next Vb from two previously calculated points 164, 166.

The first approach is represented by straight line 168 which represents linear interpolation/extrapolation and provides a next Vb 170 and a corresponding next transient analysis provides point 172 on curve 160. Thus, as can be seen from this example, a drawback of the linear method is that point 172 can be further from the solution point 162 than previously calculated point 166, such that this approach diverges. The preferred approach is the second approach, exponential interpolation/extrapolation of curve 174. In this example, the point 176 calculated by the second approach provides a next point 178 on curve 160 closer than the previous point 166. For this preferred approach, each successive point is much closer to solution point 162, results converging with each iteration.

As described above, the preferred approach requires three initialization transient runs, each run based on one of three selected equidistant body voltages, as defined by $Vb_2-Vb_1=vb_3-Vb_2$, that each identify a data point on the curve, referred to herein as $(Vb_1,q_1)$, $(Vb_2,q_2)$ and $(Vb_3,q_3)$. The TBodyItem class provides the calculation programs for the exponential interpolation/extrapolation method using the exponential function. After the first three iterations and for each iteration thereafter, Vb is calculated in 1264 to generate curve 160 described by the relationship:

$$q=A(\exp(B(Vb-V0))-1);$$

where, A, B and V0 are constants determined by:

$$A=(q_1q_3-q_2q_2)/(2q_2-q_1-q_3);$$

$$B=(Vb_2-Vb_1)^{-1}*ln((q_2+A)/(q_1+A));$$

and $$V0=B_{-1}ln((q_3 \exp(B*Vb_2)-q_2 \exp(B*Vb_3))/(q_3-q_2)).$$

V0 is the x-axis (Vb) intercept value for the next iteration extrapolated exponentially. For each subsequent iteration, i.e., beginning with the fourth iteration, taking $(Vb_n,q_n)$ and $(Vb_{n1},q_{n1})$ to be a data points calculated in the two immediately previous iterations and the body voltage for the next iteration $Vb_{n2}$ is, $$Vb_{n2}=B^{-1}* ln((q_{n1}* \exp(B*Vb_n)-q_n* \exp(B*Vb_{n1})/(q_{n1}-q_n)).$$

After calculating $Vb_{n2}$ for each device, in 1266 the calculated value is passed to the standard simulation program for subsequent transient analysis, i.e., the n+2 iteration.

Simultaneously with calculating body effects, self heating effects are calculated in each iteration. As noted above, initially, the average current is set to 0 and the change in temperature is calculated in the first transient run to determine a new temperature. Then, retrieving that new temperature in 1262, the average current is recalculated in 1264 based on the new temperature. The recalculated average current is passed to the standard models in 1266 with the results of the body effect voltages and retrieved in 1264 as the new temperature.

Once the results calculated between iterations is less than a maximum acceptable voltage difference for the body effect voltage and maximum temperature difference for self heating, then in 1268, STEADY 120 exits the iteration loop. Thermal equilibrium or thermal steady state occurs, typically, within a few iterations. Finally, in major step 128, the item list is dissolved.

As described above, STEADY 120 takes advantage of cover models. This means the simulator is not using the normal simulation device models, e.g., for transistors, but instead the cover models, which have additional properties compared to the normal models, are substituted. The additional functionality allows the cover models to communicate with STEADY 120 to carry out the necessary calculations during simulation. The cover models also include additional internal circuit elements and parameters for forcing desired transistor body voltages as initial conditions for simulation and so that during a simulation data may be saved for later use by STEADY 120.

So, in modeling a complex circuit according to the present invention, an input state is selected, an initial body potential is determined for each device using DC or static analysis. Circuit devices are biased using the initial body potentials and transient analysis is run on the circuit thus biased, in a first transient iteration for local heating analysis initialization. Body voltages are selected for the first three iterations, a corresponding charge q is derived. The three most recently derived charges are used for projecting body voltages for subsequent transient analysis iterations. This is repeated until the difference between iteration results is below a previously identified acceptable level. The final iteration is also the circuit's steady state transient response.

Further, while it may be necessary to understand how a particular circuit responds prior to PSTART 154, i.e., between START TIME and PSTART 154, such analysis is typically unnecessary after the first transient analysis run. It is also unnecessary to understand how the circuit responds after PSTOP 156, between PSTOP 156 and STOP TIME, before reaching transient steady state in the final run. Thus, STEADY 120 derives significant computational advantage over prior art methods by forgoing circuit simulation outside of PSTART 154 and PSTOP 156 during intermediate transient iterations. So, the initial analysis run begins at START TIME and terminates at PSTOP 156. The final iteration begins at PSTART 154 and ends at STOP TIME.

For further efficiency, during the initial transient pass and in subsequent passes, quiescent transistors that do not switch and, so, do not exhibit body effects under the conditions being simulated, are identified. Since these quiescent transistors are not switching, their body voltages are known from previous steady state passes. Thus, calculations for these quiescent transistors may be eliminated from macro model analysis to reduce simulation size, thereby reducing computer resource overhead (e.g., allocated memory) and improving algorithm convergence. So, preferably, only switching transistors are analyzed in the iterative extrapolation step.

As noted above, the last transient run includes the local effect steady state solution and contains final analysis for whatever was requested by the circuit designer, e.g., all circuit delays as well as exact wave forms at all identified circuit nodes. The initial transient run and the final steady state transient run may be compared to identify the history effect, i.e., the difference between the initial steady state simulation and the final transient pass, even for large circuit blocks and macros.

Applying STEADY 120, for example, to a multiple input SRAM structure has produced transient results that are within 2% and the calculated temperature rise was within 10° C. Further, by excluding non-switching transistors and restricting intermediate iterations to between PSTART and PSTOP, two orders of magnitude less computer resources are required with one third fewer iterations and 40% less computer time. So, these streamlining modifications further improve the efficiency of the STEADY 120.

Thus, it can be seen that the preferred method of the present invention evaluates the variable delays across a macro or larger circuit, allowing the steady state local effects for the circuit to be reached much more efficiently than the thousands of cycles normally required by prior art methods. Further, the method of the present invention avoids the complexities and high calculation overhead of the prior art methods, reaching an acceptable steady state within tens of cycles, translating into much less calculation time and correspondingly, much lower analysis costs. Also, the preferred method can be applied to circuits involving a larger number of transistors than the prior art, while still achieving a meaningful result. Finally, the preferred embodiment enables evaluation of history effects on a cross-section of very large circuits.

While the invention has been described in terms of preferred embodiments, those skilled in the art will recognize that the invention can be practiced with modification within the spirit and scope of the appended claims.

We claim:

1. A method of circuit design comprising the steps of:

a) creating an object list of items corresponding to circuit elements, said items modeling said corresponding circuit elements response to local effects;

b) initializing said object list responsive to an initial condition of said circuit elements;

c) analyzing a response of said circuit elements to a transient signal; and d) adjusting said object list responsive to said response.

2. A method as in claim 1, further comprising the steps of:

e) repeating the analyzing step (c) and the adjusting step (d) until the difference between adjustments made in the adjusting step is below an maximum accepted difference.

3. A method as in claim 2, wherein in said initializing step (b) said circuit elements are analyzed at a steady state to determine a static response, said objects being initialized responsive to said static response.

4. A method as in claim 3, wherein after the analyzing step (c) elements are identified as being quiescent, said quiescent elements and corresponding items being eliminated from subsequent iterations.

5. A method as in claim 3, wherein after a first iteration of said analyzing step (c) an analysis period is identified, said analysis period having a start time and a stop time, a local effect response being calculated during said analysis period.

6. A method as in claim 3, wherein said circuit elements are field effect transistors and said local effects comprises body effects.

7. A method as in claim 3, wherein said circuit elements are field effect transistors and said local effects comprises localized heating.

8. A method as in claim 7, wherein the analysis step (c) determines whether temperature changes in each analyzed field effect transistor and the adjusting step (d) extrapolates an average heat flow for each of said changes.

9. A method as in claim 8, wherein said method further comprises the steps of:

f) adjusting design characteristics of one or more field effect transistors; and, g) repeating steps (a)–(e).

10. A method as in claim 1, wherein in said initializing step (b) an initial body voltage is provided for each said circuit elements from a list of initial body voltages.

11. A computer program product for designing integrated circuits, said computer program product comprising a computer usable medium having computer readable program code thereon, said computer readable program code comprising:

computer readable program code means for creating an object list of items corresponding to circuit elements, said items modeling said corresponding circuit elements response to local effects;

computer readable program code means for initializing a circuit model of said circuit elements and corresponding said items;

computer readable program code means for iteratively analyzing a transient response of said circuit model, local effects from said items being included in said iteratively analyzed circuit model, said circuit model being analyzed until a difference between results is less than a maximum acceptable difference; and computer readable program code means for dissolving said object list.

12. A computer program product for designing integrated circuits as in claim 11, wherein said computer readable program code means for creating an object list comprises:

computer readable program code means for creating objects in a base class, each of said objects in said base class including an entry for a corresponding device model; and, computer readable program code means for creating objects in at least two specialized classes, inheriting from said base class and providing methods and storing derived data for extrapolating local effects of an associated element.

13. A computer program product for designing integrated circuits as in claim 12, wherein said at least two classes include a body class and a localized heating class.

14. A computer program product for designing integrated circuits as in claim 13, further comprising:

computer readable program code means for analyzing a circuit including a plurality of said circuit elements at a steady state to determine a static response and initializing said objects responsive to said static response.

15. A computer program product for designing integrated circuits as in claim 14, further comprising:

computer readable program code means for identifying quiescent elements and removing said quiescent elements and corresponding items from analysis in subsequent iterations.

16. A computer program product for designing integrated circuits as in claim 15, further comprising:

computer readable program code means identifying a beginning and an end of an analysis period, after an initial analysis a local effect response of elements in said circuit being determined during said analysis period.

17. A computer program product for designing integrated circuits, said computer program product comprising a computer usable medium having computer readable program code thereon, said computer readable program code comprising:

computer readable program code means for creating an object list of items corresponding to circuit elements, said items modeling said corresponding circuit elements response to local effects;

computer readable program code means for initializing a circuit model of said circuit elements including a list of initial body voltages for each of said circuit elements;

computer readable program code means for analyzing a response of said circuit model, local effects from said list being included in said analyzed circuit model; and computer readable program code means for dissolving said object list.

18. A computer program product for designing integrated circuits as in claim 17, wherein said computer readable program code means for analyzing a response of said circuit model comprises computer readable program code means for analyzing a static response of said circuit model.

19. A computer program product for designing integrated circuits as in claim 17, wherein said computer readable program code means for analyzing a response of said circuit model comprises computer readable program code means for analyzing a transient response of said circuit model.

20. A method of circuit design comprising the steps of:

a) creating an object list of items corresponding to field effect transistors (FETs) in a circuit, said items modeling said corresponding FETs response to body effects;

b) initializing said object list to a circuit static response;

c) analyzing a transient response of said circuit and determining whether charge changes in each of said FETs; and d) extrapolating a new body voltage for each of said FETs.

21. A method as in claim 20, wherein said extrapolation is an exponential extrapolation.

22. A method as in claim 20, wherein said exponential extrapolation is defined by:

$$q = A(\exp(B(Vb-V0))-1):$$

where, $$q = 0 \text{ at } V0;$$

$$A = (q_1 q_3 - q_2 q_2)/(2q_2 - q_1 - q_3);$$

$$B = (Vb_2 - Vb_1)^{-1} * \ln((q_2 = A)/(q_1 + A));$$

and $$Vb_{n2} = B_{-1} * \ln((q_{n1} * \exp(B*Vb_n) - q_n * \exp(B*Vb_{n1})/(q_{n1} - q_n)).$$

23. A method as in claim 22, wherein said method further comprises the steps of:

f) adjusting design characteristics of one or more field effect transistors; and, g) repeating steps (a)–(e).

* * * * *

UNITED STATES PATENT AND TRADEMARK OFFICE
CERTIFICATE OF CORRECTION

PATENT NO.    : 6,442,735 B1
DATED         : August 27, 2002
INVENTOR(S)   : Joshi et al.

It is certified that error appears in the above-identified patent and that said Letters Patent is hereby corrected as shown below:

Column 7,
Lines 26-27, delete "$Vb_2-Vb_{1=Vb3}-Vb_2$" and insert -- $Vb_2-Vb_1=Vb_3-Vb_2$ --;
Line 43, delete "$V0 = B_{-1} \ln ( (q_3 \exp (B*Vb_2) - q_2 \exp (B*Vb_3) ) / (q_3 - q_2) )$" and insert -- $V0 = B^{-1} \ln ( (q_3 \exp (B*Vb_2) - q_2 \exp (B*Vb_3) ) / (q_3 - q_2) )$ --.

Column 12,
Line 20, delete "$V0 = B_{-1} \ln ( (q_3 \exp (B*Vb_2) - q_2 \exp (B*Vb_3) ) / (q_3 - q_2) )$" and insert -- $V0 = B^{-1} \ln ( (q_3 \exp (B*Vb_2) - q_2 \exp (B*Vb_3) ) / (q_3 - q_2) )$ --.

Signed and Sealed this

Fifteenth Day of October, 2002

*Attest:*

JAMES E. ROGAN
*Attesting Officer*       *Director of the United States Patent and Trademark Office*